United States Patent [19]
Rauth et al.

[11] Patent Number: 5,548,542
[45] Date of Patent: Aug. 20, 1996

[54] HALF-BAND FILTER AND METHOD

[75] Inventors: Cindy C. Rauth; Perry W. Frogge; David H. Damerow, all of Palm Bay, Fla.

[73] Assignee: Harris Corporation, Melbourne, Fla.

[21] Appl. No.: 304,433

[22] Filed: Sep. 12, 1994

Related U.S. Application Data

[63] Continuation of Ser. No. 930,167, Aug. 14, 1992, abandoned.

[51] Int. Cl.⁶ ................................................ G06F 17/10
[52] U.S. Cl. ........................ 364/724.16; 364/724.13; 364/724.1
[58] Field of Search ................... 364/724.16, 724.13, 364/724.1, 724.01

[56] References Cited

U.S. PATENT DOCUMENTS

| | | | |
|---|---|---|---|
| 4,777,612 | 10/1988 | Tomimtsu | 364/724.13 |
| 4,815,023 | 3/1989 | Arbeiter | 364/724.01 |
| 4,893,265 | 1/1990 | Hirosaki | 364/724.13 |
| 4,893,316 | 1/1990 | Janc et al. | 364/724.1 |
| 4,953,118 | 8/1990 | Gockler | 364/724.13 |
| 5,067,141 | 11/1991 | Critchlow et al. | 364/724.1 |
| 5,247,515 | 9/1993 | White | 370/70 |

*Primary Examiner*—David H. Malzahn
*Attorney, Agent, or Firm*—Rogers & Killeen

[57] ABSTRACT

A digital half-band filter with mutliplications using Wallace trees which have lower bits truncated for reduction in size and with a true/complementer providing saturation compensation together with accumulator overflow compensation by monitoring bits more significant than the output bits.

12 Claims, 14 Drawing Sheets

| | 19 18 17 16 $2^{} 2^{} 2^{} 2^{}$ | 15 14 13 12 $2^{} 2^{} 2^{} 2^{}$ | 11 10 9 8 $2^{} 2^{} 2^{} 2^{}$ | 7 6 5 4 $2^{} 2^{} 2^{} 2^{}$ | 3 2 1 0 $2^{} 2^{} 2^{} 2^{}$ | # OF PARTIAL PRODUCTS |
|---|---|---|---|---|---|---|
| COEFF 1,67 =4 | 0 0 0 0 | 0 0 0 0 | 0 0 0 0 | 0 0 0 0 | 0 1 0 0<br>1 | 1 |
| COEFF 3,65 =-24 | 1 1 1 1 | 1 1 1 1 | 1 1 1 1 | 1 1 1 0<br>-1 | 1 0 0 0<br>1 | 2 |
| COEFF 5,63 =62 | 0 0 0 0 | 0 0 0 0 | 0 0 0 0 | 0 0 1 1<br>1 | 1 1 1 0<br>-1 | 2 |
| COEFF 7,61 =-144 | 1 1 1 1 | 1 1 1 1 | 1 1 1 1 | 0 1 1 1<br>-1 -1 | 0 0 0 0 | 2 |
| COEFF 9,59 =300 | 0 0 0 0 | 0 0 0 0 | 0 0 0 1<br>1 | 0 0 1 0<br>1 | 1 1 0 0<br>1 1 | 4 |
| COEFF 11,57 =-568 | 1 1 1 1 | 1 1 1 1 | 1 1 0 1<br>-1 | 1 1 0 0<br>-1 | 1 0 0 0<br>1 | 3 |
| COEFF 13,55 =1003 | 0 0 0 0 | 0 0 0 0 | 0 0 1 1<br>1 | 1 1 1 0<br>-1 | 1 0 1 1<br>1 1 1 | 5 |
| COEFF 15,53 =-1672 | 1 1 1 1 | 1 1 1 1 | 1 0 0 1<br>-1 1 | 0 1 1 1<br>1 | 1 0 0 0<br>-1 | 4 |
| COEFF 17,51 =2660 | 0 0 0 0 | 0 0 0 0 | 1 0 1 0<br>1 1 | 0 1 1 0<br>1 1 | 0 1 0 0<br>1 | 5 |
| COEFF 19,49 =-4088 | 1 1 1 1 | 1 1 1 1<br>-1 | 0 0 0 0 | 0 0 0 0 | 1 0 0 0<br>1 | 2 |
| COEFF 21,47 =6107 | 0 0 0 0 | 0 0 0 1<br>1 | 0 1 1 1<br>1 | 1 1 0 1<br>-1 | 1 0 1 1<br>-1 -1 | 5 |
| COEFF 23,45 =-8961 | 0 1 1 1 | 1 1 0 1<br>-1 | 1 1 0 0<br>-1 1 | 1 1 1 1 | 1 1 1 1<br>-1 | 4 |
| COEFF 25,43 =13072 | 0 0 0 0 | 0 0 1 1<br>1 1 | 0 0 1 1<br>1 1 | 0 0 0 1<br>1 | 0 0 0 0 | 5 |
| COEFF 27,41 =-19323 | 1 1 1 1 | 1 0 1 1<br>-1 -1 | 0 1 0 0<br>1 | 1 0 0 0<br>1 | 0 1 0 1<br>1 1 | 6 |
| COEFF 29,39 =29999 | 0 0 0 0 | 0 1 1 1<br>1 -1 | 0 1 0 1<br>1 1 | 0 0 1 0<br>1 1 | 1 1 1 1<br>-1 | 7 |
| COEFF 31,37 =-53539 | 1 1 1 1<br>-1 | 0 0 1 0<br>1 1 | 1 1 1 0<br>-1 | 1 1 0 1<br>-1 | 1 1 0 1<br>-1 1 | 7 |
| COEFF 33,35 =166178 | 0 0 1 0<br>1 | 1 0 0 0<br>1 | 1 0 0 1<br>1 | 0 0 1 0<br>1 | 0 0 1 0<br>1 | 6 |
| CENTER TAP COEFF 34 =262144 | 0 1 0 0<br>1 | 0 0 0 0 | 0 0 0 0 | 0 0 0 0 | 0 0 0 0 | 1 |

TOTAL=70 ODD FILTER PARTIAL PRODUCTS

TOTAL=1 EVEN FILTER PARTIAL PRODUCTS

| | $2^{12}$ | $2^{11}$ | $2^{10}$ | $2^9$ | $2^8$ | $2^7$ | $2^6$ | $2^5$ | $2^4$ | $2^3$ | $2^2$ | $2^1$ | $2^0$ |
|---|---|---|---|---|---|---|---|---|---|---|---|---|---|
| wtree 1 | 8 | 8 | 8 | 8 | 8 | 8 | 7 | 7 | 7 | 6 | 4 | 2 | 0 |
| wtree 2 | 11 | 11 | 11 | 11 | 10 | 8 | 8 | 7 | 6 | 6 | 2 | 0 | 0 |
| wtree 3 | 8 | 8 | 8 | 6 | 6 | 6 | 6 | 6 | 6 | 6 | 4 | 4 | 2 |
| wtree 4 | 4 | 4 | 4 | 4 | 4 | 2 | 0 | 0 | 0 | 0 | 0 | 0 | 0 |
| wtree 5 | 10 | 10 | 8 | 8 | 6 | 6 | 6 | 4 | 2 | 2 | 2 | 0 | 0 |
| wtree 6 | 7 | 6 | 5 | 5 | 5 | 5 | 5 | 5 | 4 | 4 | 2 | 1 | 1 |
| wtree 7 | 3 | 3 | 3 | 2 | 2 | 1 | 1 | 1 | 1 | 1 | 1 | 1 | 1 |
| wtree 8 | 8 | 6 | 6 | 6 | 4 | 2 | 2 | 2 | 2 | 0 | 0 | 0 | 0 |
| wtree 9 | 8 | 8 | 8 | 6 | 6 | 6 | 4 | 4 | 4 | 4 | 4 | 2 | 2 |
| wtree 10 | 8 | 8 | 8 | 6 | 6 | 4 | 4 | 4 | 2 | 0 | 0 | 0 | 0 |
| wtree 11 | 5 | 4 | 4 | 4 | 4 | 3 | 3 | 3 | 2 | 2 | 2 | 1 | 1 |
| wtree 12 | 8 | 8 | 6 | 6 | 6 | 4 | 4 | 4 | 2 | 2 | 2 | 2 | 0 |
| CARRIES FROM PARTIAL PRODUCTS THAT WERE INVERTED | 88 | 84 | 79 | 72 | 67 | 55 | 50 | 47 | 38 | 33 | 23 | 13 | 7 |
| | 6 | 2 | 2 | 2 | 2 | 4 | 2 | 8 | 2 | 0 | 4 | 2 | 4 |
| TOTAL | 94 | 86 | 81 | 74 | 69 | 51 | 52 | 55 | 40 | 33 | 27 | 15 | 11 |
| CARRIED FROM PREVIOUS COLUMN | 80 | 74 | 67 | 61 | 53 | 47 | 43 | 32 | 25 | 18 | 10 | 5 | 0 |
| TOTAL/COLUMN | 174 | 160 | 148 | 135 | 122 | 106 | 95 | 87 | 65 | 51 | 37 | 20 | 11 |
| # OF BITS TO DECODE EACH COLUMN | 8 | 8 | 8 | 8 | 7 | 7 | 7 | 7 | 7 | 6 | 6 | 5 | 4 |

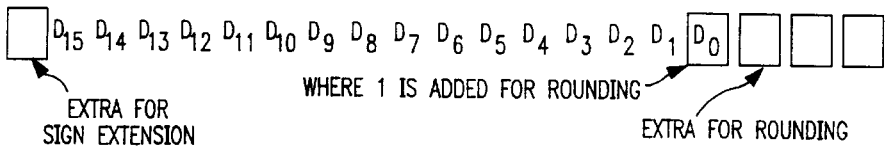

FIG. 13

EXTRA FOR SIGN EXTENSION

WHERE 1 IS ADDED FOR ROUNDING

EXTRA FOR ROUNDING

TRUNCATE ANY PARTIAL PRODUCTS TO RIGHT OF TMI LINE

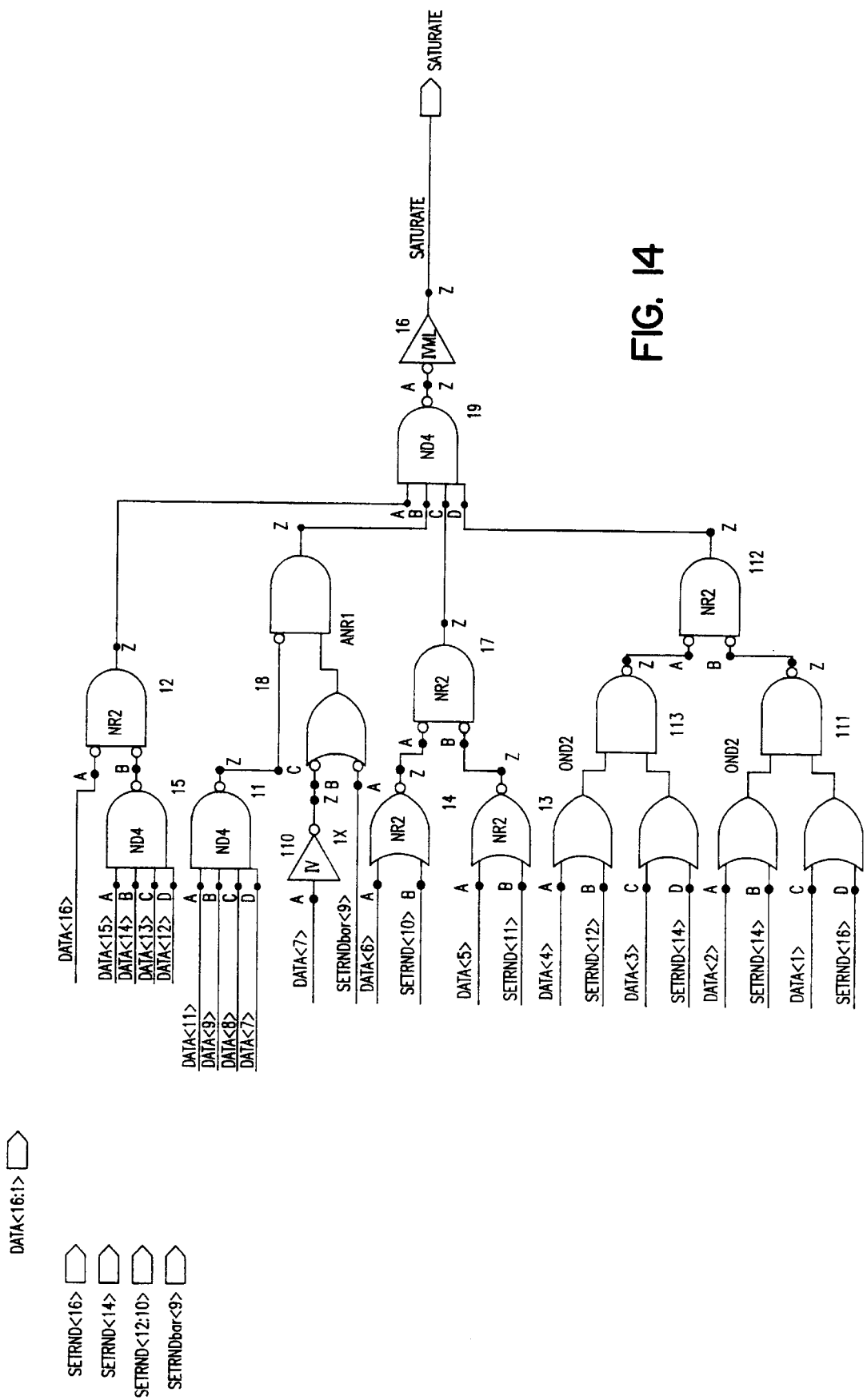

5,548,542

HALF-BAND FILTER AND METHOD

This is a continuation of application Ser. No. 07/930,167, filed Aug. 14, 1992, now abandoned.

BACKGROUND AND SUMMARY OF THE INVENTIONS

The present invention relates to electronic devices, and, more particularly, to semiconductor circuits and methods useful for filtering digital data streams.

DIGITAL SYSTEMS WITH HALF-BAND FILTERING

Communications systems, such as broadcast radio, use frequency division multiplexing (FDM) to simultaneously transmit differing information signals from several sources in a single locale. Typically, each source modulates its carrier frequency with its information signal and keeps within its allocated frequency band. Extraction of a desired information signal from a received broadband of simultaneous broadcasts may be performed by mixing down (down conversion by the selected carrier frequency) followed by lowpass filtering and demodulation as schematically illustrated by system 100 in FIG. 1. Indeed, system 100 receives radio frequency signals (e.g., 100–200 MHz) at antenna 102, filters and mixes the signals down to intermediate frequencies (e.g., 1–10 MHz) with a wideband tuner 104, converts from analog to digital format with sampling analog-to-digital converter 106, extracts the selected frequency band (e.g., of width 5 KHz) with digital down converter 108 which performs the down conversion and filtering, and demodulates and reconstructs an analog information signal with demodulator/processor 110. For example, if wideband tuner 104 has a 10 MHz output bandwidth, then analog-to-digital converter 106 will sample at 20 MHz or more (at least the Nyquist rate), and digital down converter 108 will output a 5 KHz selected band at a sampling rate of 10 KHz. That is, digital down converter 108 may decrease the sampling rate due to the small bandwidth of its output without loss of information.

The problems of construction of system 100 include realizing digital down converter 108 operating at a high sampling frequency while maintaining a low ripple sharp cutoff filter which has programmable down conversion frequency and programmable bandwidth. Known realizations of a down conversion function include the combination of a numerically controlled oscillator/modulator (NCOM) such as the HSP45106 manufactured by Harris Corporation together with two decimating lowpass digital filters (one for the in-phase and one for the quadrature outputs of the NCOM) such as the HSP43220 also manufactured by Harris Corporation.

A lowpass decimating filter having a decimation rate R which may be factored as $$R = R_1 R_2 \ldots R_M$$

may be realized as M cascaded independent lowpass decimation filters with the jth filter having decimation rate $R_j$. This multistage approach may greatly reduce the number of computations required to perform the filtering. Indeed, the first stages in a multistage filter need not have narrow transition bands because the transition band of the last stage will essentially determine the overall transition band. Further, the early stages decimate the sampling rate so the latter stages operate at a much lower sampling frequency.

Multistage filters may be effectively designed with stages of half-band filters. A lowpass digital FIR filter with optimal (equiripple) design and with symmetry about $\pi/2$ is called a half-band filter. That is, a half-band filter has a transfer function Fourier transform as shown in FIG. 2a with passband and stopband of equal width. Half-band filters have about one half of their filter coefficients equal to zero, so the filter computations include only about one half as many multiplications as a usual FIR filter.

Half-band filters may appropriately be used only for decimation or interpolation of sampling rate by a factor of 2 and when aliasing to the final transition band is permitted. See FIG. 2b illustrating the aliasing of a decimation by 2 half-band filter. Thus multistage filters with powers of 2 decimation or interpolation profitably employ cascaded half-band filters.

Crochiere and Rabiner, Multirate Digital Signal Processing (Prentice-Hall 1983) provides general information regarding signal processing using sampling rate changes. Hogenauer, An Economical Class of Digital Filters for Decimation and Interpolation, 29 IEEE Tr.Ac.Sp.Sig.Proc. 155 (1981) discloses decimation filters made of an integrator section followed by comb section operating a low sampling rate.

Features

The present invention provides a digital half-band filter with truncated multipliers and joint overflow and saturation compensating complementers. The truncated multipliers reduce the amount of hardware, and the complementers permit full dynamic range

BRIEF DESCRIPTION OF THE DRAWINGS

The present invention will be described with reference to the accompanying drawings, which are schematic for clarity:

FIG. 10 shows the re-coded coefficients;

FIG. 12 shows the sign extension words;

FIG. 13 illustrates the truncation decision; and

FIG. 14 is a schematic for saturation detection within rounding.

DESCRIPTION OF THE PREFERRED EMBODIMENTS

Architectural Overview

Figure 1:
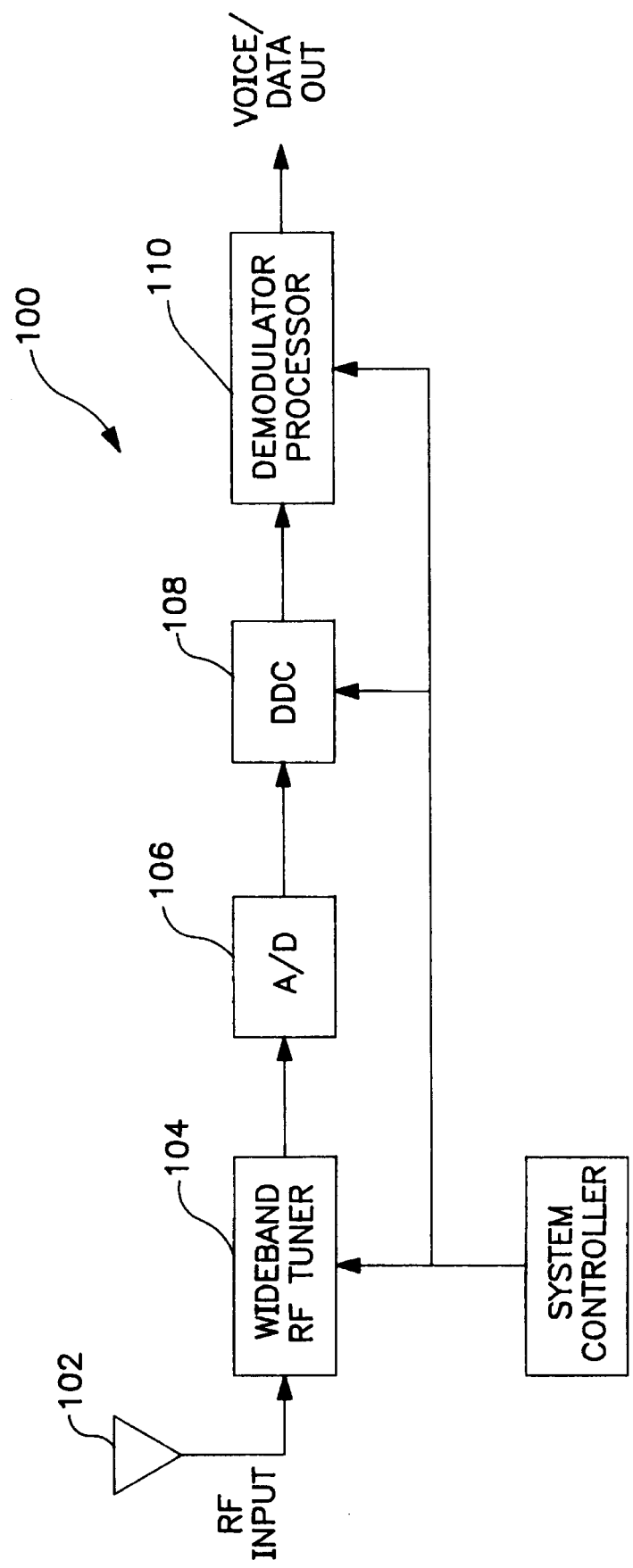
FIG. 1 illustrates a first application of a first preferred embodiment.
Figure 2A:
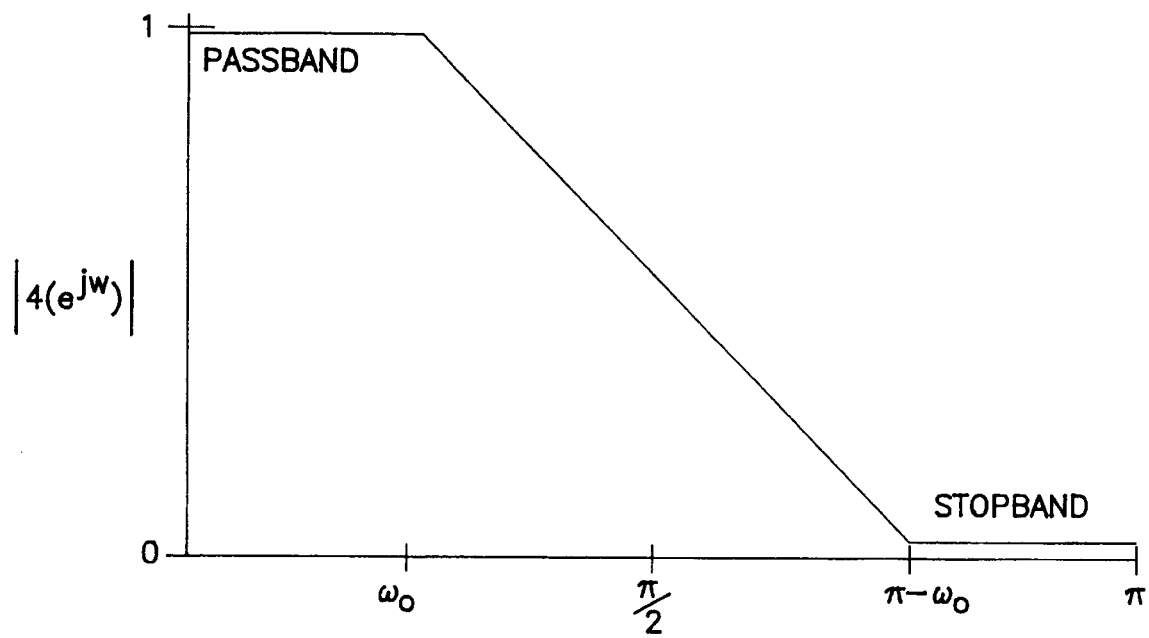
FIGS. 2a–b show half-band filter characteristics.
Figure 2B:
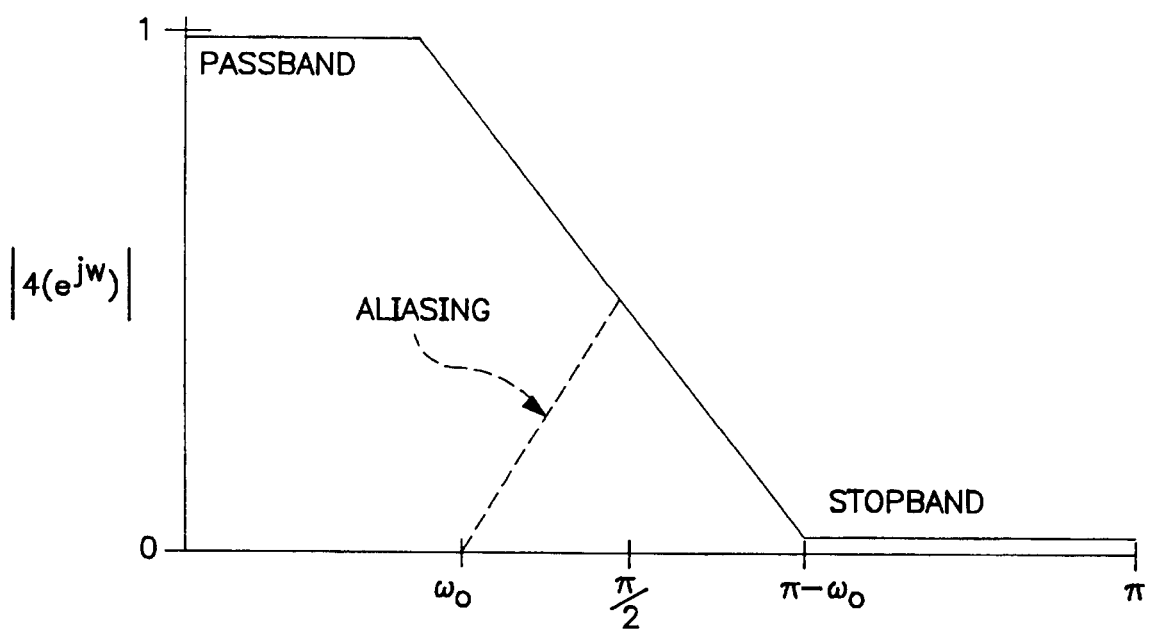
Figure 3:
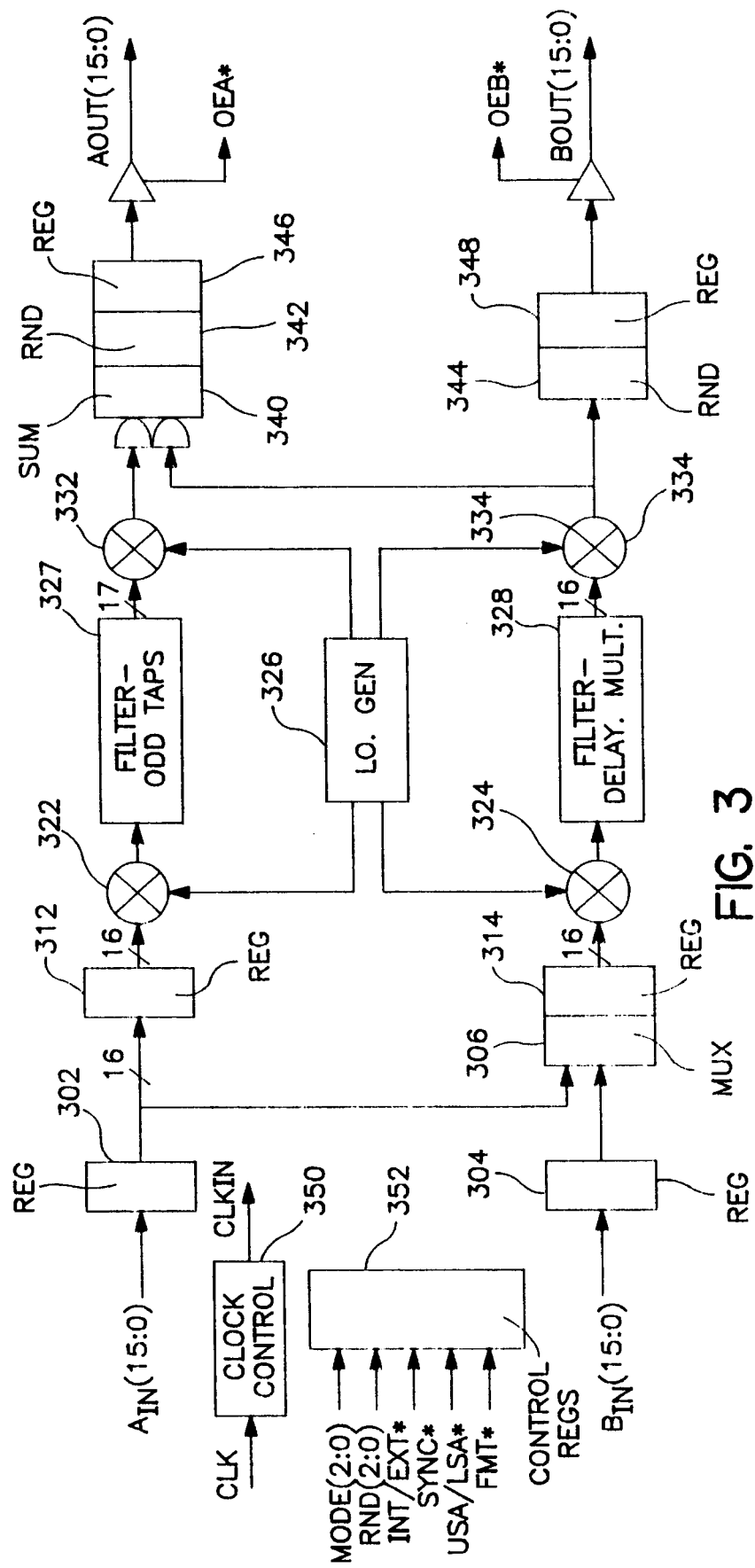
FIG. 3 is a functional block diagram of a first preferred embodiment half-band filter.

FIG. 3 is a functional block circuit diagram of a first preferred embodiment single chip digital half-band filter generally denoted by reference numeral 300, which includes the following blocks and items: 16-bit parallel port register 302 for input data samples Ain(15:0), 16-bit parallel port register 304 for input data samples Bin(15:0), multiplexer 306 for selecting between Ain and Bin input, 16-bit registers 312 and 314 for holding inputs, multipliers 322 and 324 for downconversion, local oscillator 326 for generating the sines and cosines for downconversion and upconversion, FIR filter odd arm 327 and even arm 328 for the lowpass half-band filtering, multipliers 332 and 334 for upconversion, adder 340 for combining signals in real output, rounders 342 and 344 for rounding to 16, 14, 12, 11, 10, 9, or 8 bits, output registers 346 and 348, clock control 350, and control registers 352 for selecting mode of operation, rounding level, positive or negative frequency conversion, internal versus external multiplexing, synchronization, and output format. Note that multipliers 322, 324, and 334 output 16-bit data, but that FIR filter odd arm 327 outputs 17-bit data to provide for rounding to 16 bits.

Operation Summary

Figure 4:
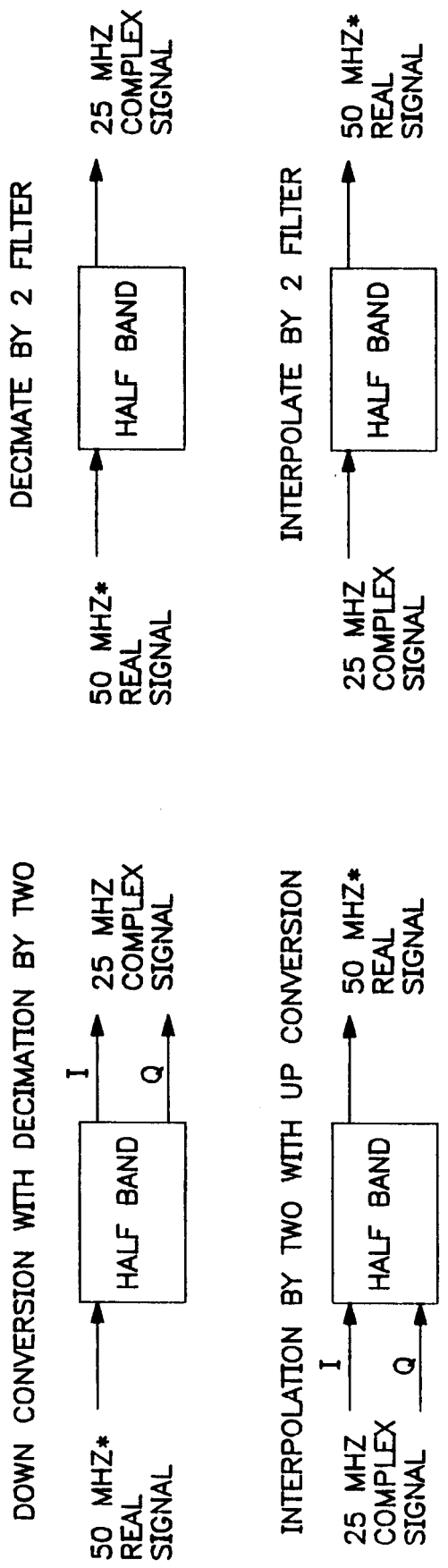
FIG. 4 illustrates four modes of operation of the present invention.
Figure 5:
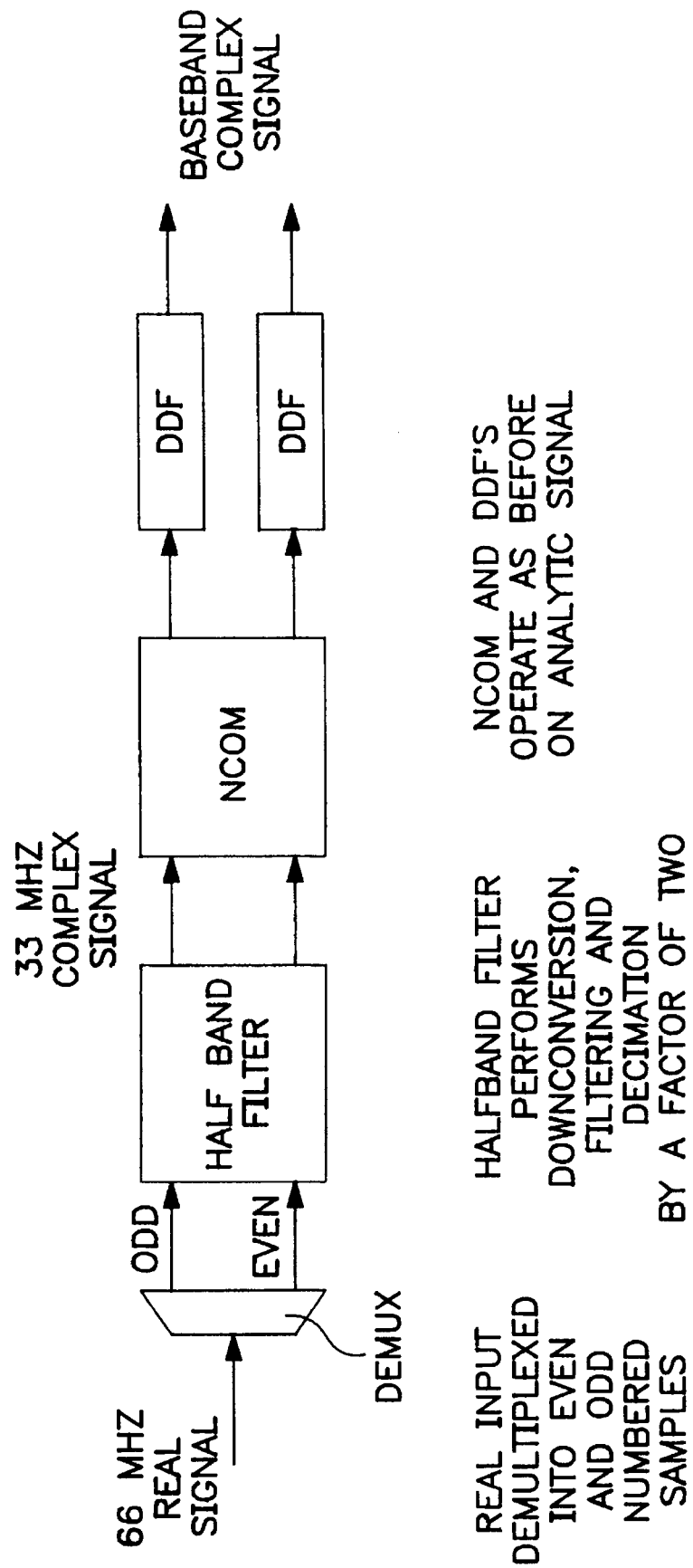
FIG. 5 illustrates an application of a preferred embodiment.
Figure 6A:
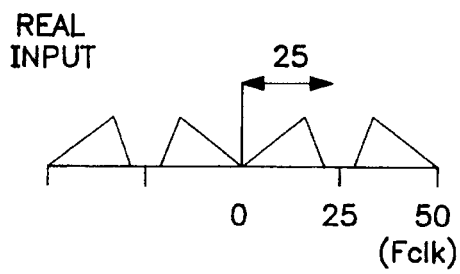
FIGS. 6(A)–(F) illustrate the sequence of the filtering operation in the downconversion and decimation by two mode.
Figure 6B:
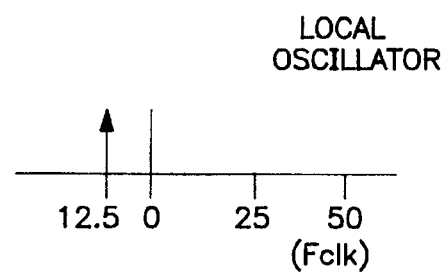
Figure 6C:
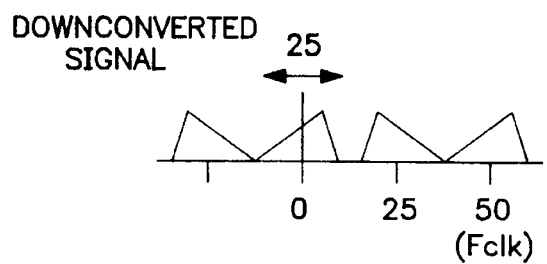
Figure 6D:
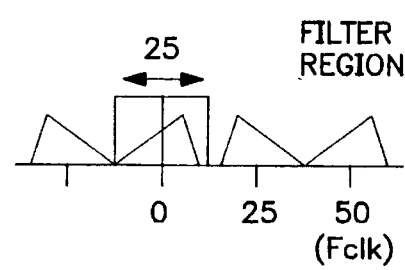
Figure 6E:
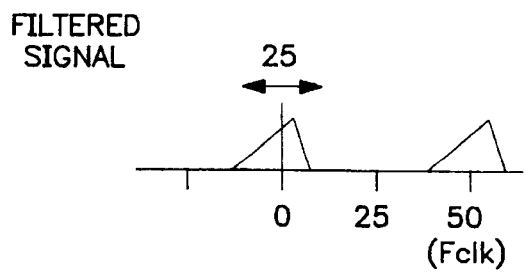
Figure 6F:
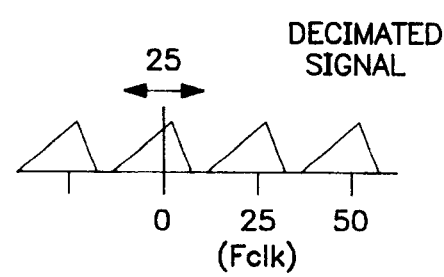
Figure 7A:
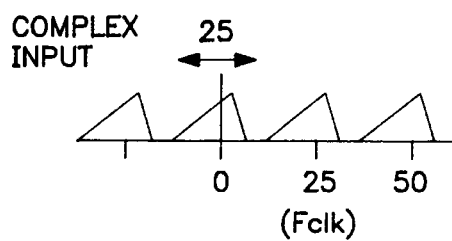
FIGS. 7(A)–(G) illustrate the sequence of the filtering operation in the interpolate by two and upconversion mode.
Figure 7B:
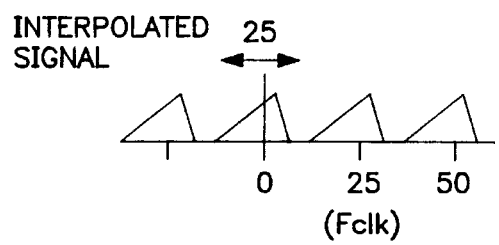
Figure 7C:
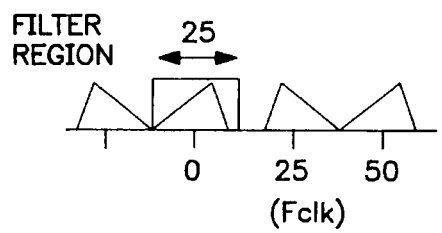
Figure 7D:
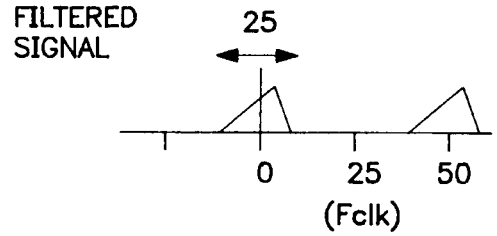
Figure 7E:
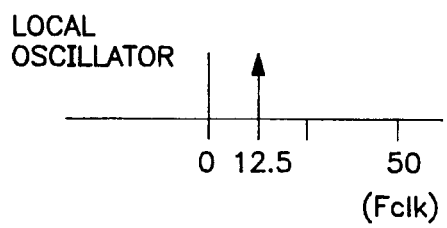
Figure 7F:
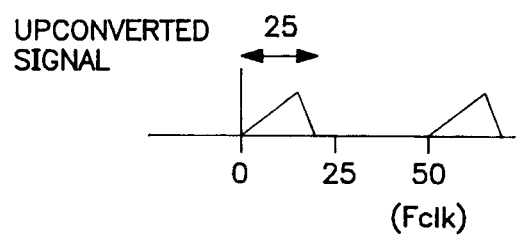
Figure 7G:
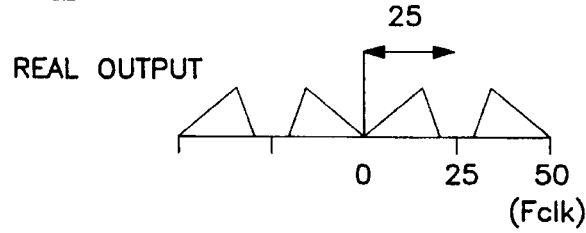

Filter 300 is a 67-Tap, 20-bit, fixed coefficient filter that has four basic modes of operation illustrated in FIG. 4: (1) decimation by two filtering of a real input signal; (2) interpolation by two filtering of a real input signal; (3) quadrature downconversion of a real I.F. signal with decimation by two filtering of the resulting I and Q channels; and (4) interpolation by two filtering of a complex baseband signal and quadrature upconversion to produce a real output signal. The first two modes are useful for easing the requirements on the analog antialiasing filter used with a D/A converter or a A/D converter. The last two modes are provided for expanding the processing bandwidth of the Harris HSP 45116 numerically controlled oscillator/modulator (NCOM) and the Harris HSP43220 decimating digital filter (DDF). Indeed, FIG. 5 shows an application of filter 300 with the NCOM and two DDFs.

The third mode listed above converts a real non-baseband signal to a baseband complex signal. To preserve all of the information in the signal, the complex sample stream will only have to clock at half the input sample rate. This allows an A/D converter clock at twice the clock rate that the NCOM and DDF can run, i.e. a 25 MHz NCOM and DDF could be used with a 50 MHz A/D and process a signal bandwidth of almost 25 MHz. See FIG. 6.

The fourth mode permits using the NCOM or HSP45216 (NCO16) as a modulator. This mode converts the quadrature baseband output of the NCOM or NCO16 to twice the clock rate and shifts the center frequency to FCLK/4. (FCLK is the output clock rate.) This allows a 25 MHz NCOM or NCO16 to drive a 50 MHz D/A and get almost 25 Mhz of tuning range. See FIG. 7.

The filter response of half-band filter 300 has a shape factor, (Passband+Transition Band)/Passband of 1.24:1 with 90 dB alias free passband at 80% of Nyquist. There is less than 0.0005 dB of passband ripple. Due to characteristics of the half-band filter, half of the coefficients are zero (with the exception of the center tap). The center tap is effectively a delay and multiply of the input signal.

A programmable, symmetric rounding stage (rounders 342–344) with saturation logic is provided to select from 8 to 16 bits of output, depending on the user's application. Outputs are available as Two's Complement or Offset Binary. There is also a pin available to give the user a selection of shifting output to positive or negative frequencies (upper or lower side band).

Half-band filter 300 is a 67-Tap, 20-bit, fixed coefficient filter. The characteristics of a half-band filter are such that the coefficient set is symmetric with every even coefficient being zero, except for the center tap. The filter is divided into even and odd arms of the filter. Since the even coefficients are all zero with the exception of the center tap, the even filter arm is effectively a delay and multiply. In FIG. 3 the odd filter coefficients are in the top arm and the delay and multiply of the even center tap is in the lower arm of the filter. The four basic modes of operation are selected by the Mode 0-1 pins:

| Mode 1 pin | Mode 0 pin | Mode of operation |
|---|---|---|
| 0 | 0 | Decimation by 2 Filter |
| 0 | 1 | Interpolation by 2 Filter |
| 1 | 0 | Downconversion with Decimation Filter |
| 1 | 1 | Interpolation Filter with Upconversion |

Decimation by Two Filter Mode.

For the decimation by two filter mode with internal muxing (INT/EXT# pin=1), 16-bit real data is input on Ain(15:0). The incoming data samples are divided into odd and even samples. The input samples come in at the fastest clock rate (CLK) and are multiplexed into odd and even samples at this rate. The FIR section of the chip, and the output samples will run at the rate of CLK/2. The odd samples of data are multiplexed through the top arm of the filter, and the even samples are multiplexed through the lower arm of the filter. The two filter outputs are summed together to give one 16-bit output sample on Aout(15:0). The following illustration shows the proper decimation by two filter response using a standard, 67-tap filter with coefficients $c_1, c_2, \ldots c_{67}$ so the center tap corresponds to $c_{34}$. For an input stream of 16-bit data words $X_1, X_2, X_3, \ldots$ the filter forms the decimated-by-2 output stream $Y_1, Y_3, Y_5, \ldots$ where $$Y_1 = c_1 X_{67} + c_2 X_{66} + c_3 X_{65} + \ldots + c_{34} X_{34} + \ldots + c_{66} X_2 + c_{67} X_1$$

$$Y_3 = c_1 X_{69} + c_2 X_{68} + c_3 X_{67} + \ldots + c_{34} X_{36} + \ldots + c_{66} X_4 + c_{67} X_3$$

$$Y_5 = c_1 C_{71} + c_2 X_{70} + c_3 X_{69} + \ldots + c_{34} X_{38} + \ldots + c_{66} X_6 + c_{67} X_5$$

A half-band filter has $c_j = 0$ for all even $j$ except the center tap $c_{34}$. Thus the decimated-by-2 output stream is $$Y_1 = c_1 X_{67} + c_3 X_{65} + \ldots + c_{34} X_{34} + \ldots + c_{65} X_3 + c_{67} X_1$$

$$Y_3 = c_1 X_{69} + c_3 X_{67} + \ldots + c_{34} X_{36} + \ldots + c_{65} X_5 + c_{67} X_3$$

$$Y_5 = c_1 C_{71} + c_3 X_{69} + \ldots + c_{34} X_{38} + \ldots + c_{65} X_7 c_{67} X_5$$

Looking at the data that is left, only the odd data ($X_1, X_3, X_5, \ldots$) goes to the odd coefficients and only the even data ($X_2, X_4, X_6, \ldots$) goes to the even coefficient. This allows half-band filter 300 to be implemented by the odd samples proceeding through the odd arm 327 with odd coefficients and the even samples proceeding through the even arm which is just a multiplication by center tap coefficient $c_{34}$ and a delay, and the two filter arms' outputs are added.

For the decimation by two filter mode with external muxing (INT/EXT# pin=0), odd and even data are input through both input ports Ain(15:0) and Bin(15:0) with each clock. Odd data comes in Ain(15:0) and even data comes in Bin(15:0). The input multiplexer is disabled, and the entire chip will run at the same clock rate from the inputs through the FIR section, and out through the output port Aout(15:0). The local oscillator 326 and multipliers 312 and 314 are not used.

Interpolation by Two Filter Mode.

In this mode data always comes in Ain (15:0) and goes to odd and even arms of the filter as in the decimation by two filter mode. For the interpolation by two filter mode with internal muxing, (INT/EXT# pin=1), real data comes in through Ain(15:0) at CLK/2. The FIR section will also run at CLK/2, while output samples from each arm of the filter is muxed out through Aout(15:0) at the rate of CLK. In order to achieve interpolation by two, the data samples effectively have zeroes placed between them before being multiplied by filter coefficients. The following illustration shows the proper interpolation by two filter response using a standard, 67-tap filter with coefficients $c_1, c_2, \ldots c_{67}$ so the center tap corresponds to $c_{34}$. For an input stream of 16-bit data words $X_1, X_2, X_3, \ldots$ the interpolation 0's lead to the stream $X_1, 0, X_2, 0, X_3, \ldots$ into the filter to form the interpolated-by-2 output stream $Y_1, Y_2, Y_3, \ldots$ where $$Y_1 = c_1 X_{34} + c_3 X_{33} + c_5 X_{32} + \ldots + c_{65} X_2 + c_{67} X_1$$

$$Y_2 = c_2 X_{34} + c_4 X_{33} + c_6 X_{32} + \ldots + c_{64} X_3 + c_{66} X_2$$

$$Y_3 = c_1 X_{35} + c_3 X_{34} + c_5 X_{33} + \ldots + c_{65} X_3 + c_{67} X_2$$

Note that in each output response, only the odd filter coefficient terms have nonzero values, or the even filter coefficient terms have nonzero values, but never a mix of both. This allows half-band filter 300 to be implemented as alternating outputs from the odd arm and the even arm to Aout(15:0). Again, the even arm is effectively a delay and multiply by the center tap coefficient $c_{34}$.

For the interpolation by two filter mode with external muxing (INT/EXT# pin=0), data comes in through the Ain(15:0) at the rate of CLK. The entire chip will run at CLK with two samples being output each cycle (one on Aout(15:0), the other on Bout(15:0)). It is important to note that the data on Bout(15:0) is the first piece of data per cycle and if internal muxing is used, this will be the first output sample on Aout(15:0).

Quadrature Downconversion with decimation by Two Filtering on resulting I and Q channels.

This mode will convert a real, non-baseband signal to a baseband complex signal, and decimate the resulting I and Q channels by two. If internal muxing is selected, (INT/EXT# pin=1), real data is input on Ain(15:0). The incoming data samples are divided into odd and even samples. The input samples come in at the fastest clock rate (CLK) and are multiplexed into odd and even samples at this rate. Each of the odd and even samples pass through multipication by local oscillator (L.O.) 326 before going to the filter arms. The FIR section of the chip, and the output samples will run at the rate of CLK/2. The odd samples of data go through the odd arm 327 of the filter, and the even samples go through the even arm 328 of the filter. The top and lower arms of the filter generate the resulting I and Q channels.

The following illustration shows the proper quadrature downconversion and decimation by two filter response using a standard, 67-tap filter (decimation by two means to eliminate every other output sample): Input data samples $X_1, X_2, X_3, X_4, X_5, \ldots$ are multiplied by $\cos(2\pi n F_s/4F_s)$ to yield a stream of odd samples $X_1, 0, -X_3, 0, X_5, 0, -X_7, 0, X_9, \ldots$ and are multiplied by $\sin(2\pi n F_s/4F_s)$ to yield a stream of even samples $0, X_2, 0, -X_4, 0, X_6, 0, -X_8, 0, \ldots$ The filtered odd samples decimated by 2 and output as Aout(15:0) are $$Y_1 = -c_1 X_{67} + c_3 X_{65} - c_5 X_{63} + \ldots - c_{65} X_3 c_{67} X_1$$

$$Y_3 = c_1 X_{69} - c_3 X_{67} + c_5 X_{65} + \ldots + c_{65} X_5 - c_{67} X_3$$

$$Y_5 = -c_1 X_{71} + c_3 X_{69} - c_5 X_{67} + \ldots - c_{65} X_7 + c_{67} X_5$$

and the filtered even samples decimated by 2 and output as Bout(15:0) are $$Z_1 = +c_2 X_{66} - c_4 X_{64} + \ldots - c_{64} X_4 + c_{66} X_2$$

$$Z_3 = -c_2 X_{68} + c_4 X_{66} + \ldots + c_{64} X_6 - c_{66} X_4$$

$$Z_5 = +c_2 X_{70} - c_4 X_{68} + \ldots - c_{64} X_8 + c_{66} X_6$$

Looking at the data that is left, only the odd data goes to the odd coefficients and only the even data goes to the even coefficients. Also note that the local oscillator multipliers 322-324 can be reduced to $(1, -1)$ multipliers since the even data never goes to the odd coefficients and vice versa for the odd data. This results in passing data on the positive one multiply, and taking the two's complement of the data when multiplying by negative one. This allows filter 300 to be implemented as true/complementer 322 providing alternating signs on the odd data which proceeds through the filter odd arm 327 and outputs as Aout(15:0), and true/complementer 324 providing alternating signs on the even data which proceeds through the filter even arm 328 (which is just delay and multiply by $c_{34}$) and outputs as Bout(15:0).

For the decimation by two filter mode with external muxing (INT/EXT# pin=0), odd and even data are input through both input ports Ain(15:0) and Bin(15:0), respectively, with each clock. The input multiplexer is disabled, and the entire chip will run at the same clock rate from the inputs, through the L.O.'s and FIR section, and out through the output ports Aout(15:0) and Bout(15:0).

Down conversion and shifting towards positive infinity is accomplished by convolving the data spectrum with an impulse located at positive frequency $F_s/4$. This impulse is derived from a vector rotating clockwise about the unit circle. Downconversion and shifting towards negative infinity is accomplished by convolving the data spectrum with an impulse located at negative frequency $-F_s/4$. This impulse is the result of a vector rotating counter clockwise about the unit circle. The USB/LSB# pin is provided to allow the user to select the Upper Side Band (input=1) or the Lower Side Band (input=0) for this mode. See FIG. 6 for an example of downconversion and decimate by two filtering operation.

Interpolation by Two filtering of Complex Baseband Signal and Quadrature Upconversion.

This mode converts the quadrature baseband output of the HSP45116 (NCOM) or HSP45106 (NCO16) to twice the clock rate and shifts the center frequency to FCLK/4 (FCLK is the output clock rate). If internal muxing is selected, (INT/EXT# pin=1), complex data is input on Ain(15:0) and Bin(15:0) at the rate of CLK/2. The data samples effectively have zeroes placed between them before being multiplied by the filter coefficients. The output from the FIR section then pass through local oscillators which upconverts the signal to the frequency of FCLK/4. The FIR section of the chip and the local oscillators will run at CLK/2. Both of the local oscillators generate output samples which will be muxed out at Aout(15:0) at the rate of CLK. The following illustration shows the proper interpolation and upconversion using a standard, 67-tap filter with coefficients $c_1, c_2, \ldots c_{67}$ so the center tap corresponds to $c_{34}$. For an input stream of 16-bit data words $X_1, X_2, X_3, \ldots$ at Ain(15:0) the interpolation 0's lead to the stream $X_1, 0, X_2, 0, X_3, \ldots$ into the filter to form the interpolated-by-2 output stream $Y_1, Y_2, Y_3, \ldots$ where $$Y_1 = c_1 X_{34} + c_3 X_{33} + c_5 X_{32} + \ldots + c_{65} X_2 + c_{67} X_1$$

$$Y_2 = c_2 X_{34} + c_4 X_{33} + c_6 X_{33} + \ldots + c_{64} X_3 + c_{66} X_2$$

$$Y_3 = c_1 X_{35} + c_3 X_{34} + c_5 X_{33} + \ldots + c_{65} X_3 + c_{67} X_2$$

Then the upconversion multiplication by $\cos(2\pi n F_s/4F_s)$ yields a stream of odd samples $Y_1, 0, -Y_3, 0, Y_5, 0, -Y_7, 0,$ $Y_9, \ldots$ And for an input stream of 16-bit data words $U_1, U_2, U_3, \ldots$ at Bin(15:0) the interpolation 0's lead to the stream $U_1, 0, U_2, 0, U_3, \ldots$ entering the filter to form the interpolated-by-2 output stream $V_1, V_2, V_3, \ldots$ where $$V_1 = c_1 U_{34} + c_3 U_{33} + c_5 U_{32} + \ldots + c_{65} U_2 + c_{67} U_1$$

$$V_2 = c_2 U_{34} + c_4 U_{33} + c_6 U_{33} + \ldots + c_{64} U_3 + c_{66} U_2$$

$$V_3 = c_1 U_{35} + c_3 U_{34} + c_5 U_{33} + \ldots + c_{65} U_3 + c_{67} U_2$$

The upconversion multiplication by $\sin(2\pi n F_s/4F_s)$ then yields a stream of even samples $0, V_2, 0, -V_4, 0, V_6, 0, -V_8, 0, \ldots$ Note that in each output response, either the odd filter coefficient terms have nonzero values or the even filter coefficient terms have nonzero values, but never a mix of both. This allows Bin samples to be muxed on one cycle and Ain samples the next. The local oscillators are reduced to (1, −1) multipliers. Filter 300 is implemented by the odd samples proceeding through the odd arm and then given alternating signs by true/complementer 332 and then output as Aout, and the even samples given alternating signs by true/complementer 334 and also output as Aout interleaved with the odd samples.

For the interpolation by two with upconversion mode with external muxing (INT/EXT# pin=0), complex data, I and Q, are input through both input ports Ain(15:0) and Bin(15:0), respectively, with each clock. The input multiplexer is disabled, and the entire chip will run at the same clock rate from the inputs, through the L.O.'s and FIR section, and out through the output ports Aout(15:0) and Bout(15:0). It is important to note that the data on Bout(15:0) is the first piece of data per cycle and if internal muxing is used, this will be the first output sample on Aout(15:0).

In this mode the USB/LSB# pin will translate the data towards positive infinity for the upper Side Band (input=1) and towards negative infinity for the Lower Side Band (input=0).

See FIG. 7 for an example of the interpolation by two filtering and upconversion application.

Parameter Selection

The user selects the mode of operation and asserts the SYNC# pin. The filter 300 expects to see the first (odd) piece of data on the following clock. SYNC# can be pulsed low at the beginning or it can run off a divided clock. If running off of a divided clock, it is restricted to clock/4 for modes which use internal mux and either oscillator, and clock/2 for all other modes.

If the FMT pin is high, filter 300 will output data in Offset Binary Format. If FMT is low, the output data will be in Two's Complement Format.

Aout(15:0) and Bout(15:0) are three-state control output busses controlled by OEA# and the OEB# (active low). There are also three other input pins to control the outputs. RNDO-2 input pins provide rounding control and allow the user to select the number of output bits from eight to sixteen.

| RND (2.0) | FUNCTION |
|---|---|
| 000 | Round for 8 output bits, zero bits below. |
| 001 | Round for 9 output bits, zero bits below. |
| 010 | Round for 10 output bits, zero bits below. |
| 011 | Round for 11 output bits, zero bits below. |
| 100 | Round for 12 output bits, zero bits below. |
| 101 | Round for 14 bits, zero bits below. |
| 110 | Round for 16 bits, zero bits below. |
| 111 | Zero all outputs. |

Top Level Circuits

As explained above, the local oscillators effectively multiply the data by 1 and −1. This means that true/complementers 322, 324, 332, and 334 either pass data or invert and add 1 (two's complement). A tree structure is used to maximize speed. An alternative eliminates the incrementers and inserts the carry into the Wallace trees. There are several ways this could be done but they add complexity and do not give a clear hardware savings.

With the sum of all coefficients being less than 1.0, and with 16 bits of data and 20 bits for coefficients, the maximum bit position required under steady state conditions is $2^{15} \times 2^{19} = 2^{34}$. Therefore, the maximum width for Wallace trees is $2^{34}$, but in order to determine overflow during transient filter response, one more bit is kept, which brought the width of the Wallace trees to $2^{35}$. After truncation of bits $2^8$ and below, described in the following, 27 bits were kept in the Wallace trees and a full width final adder is used. In mode 1 (decimation mode), the upper and lower arms of the filter are added together. In this mode, the bit positions $2^{34}$ through $2^{18}$ (17 bits) are selected from the output of the adder. In all other modes where the two arms of the filter are not added, bit positions $2^{33}$ through $2^{17}$ (17 bits) will be selected from the output of the adder. The bit positions refer to the Wallace tree bit positions. $2^{35}$ was highest Wallace tree bit and $2^9$ was lowest that was kept. Therefore, there were 27 bits of accuracy. Due to combinations of sums and carries in Wallace trees, filter 300 has a 23 bit full adder following the last Wallace tree. No rounding occurs in the bottom data path through the even arm when 16 bit outputs are chosen as there are only 16 bits of data.

For Mode 1, since only Aout(15:0) is used, Bout(15:0) is being used as a test bus.

The filter 300 outputs can be in 2's complement or offset binary format as selected by FMT.

FIR

Figure 8:
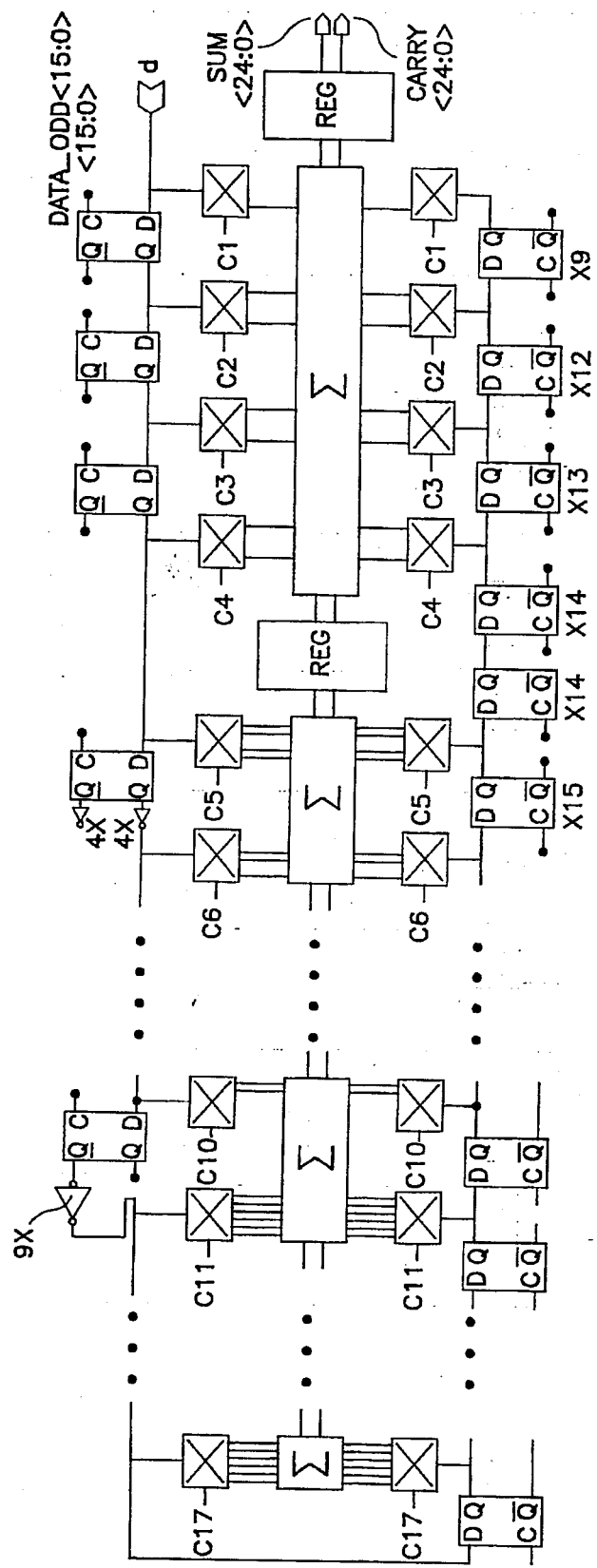
FIG. 8 illustrates in block form FIR filter.

FIG. 8 shows the functional architecture of the 67 tap FIR filter. The multiplications of filter coefficents by data samples is carried out by a hardware which adds partial products in Wallace trees. These partial products are generated by hardwired, Booth Type recoding of the filter coefficients. This recoding was used to reduce the number of partial products required. To illustrate recoding and Wallace tree summation, first consider the multipication of a 16-bit multiplicand (the data sample) by a 20-bit multiplier (the filter coefficient). Written out, this product is seen to be the sum of easily-generated partial products. For example, the multiplication of 1111000011110000 by 01010101011111111101 is:

```
        1111000011110000
    × 01010101011111111101
        1111000011110000
        000000 ...  00000
        111100 ...  10000
        111100 ...  10000
              ...
        111100 ... 100 00
      + 00000 ...   0000
```

Clearly, each of the 20 partial products may be generated by merely shifting the multiplicand for a corresponding 1 in the multiplier and by putting in 0s for a corresponding 0 in the multiplier. That is, the multiplicand feeding a multiplexer array controlled by the multiplier can provide the shifting and zeroing to form the partial products. If the numbers are in two's complement format, then sign extension bits would be inserted to extend the leading 1's in negative partial products out to the sign bit position. The summing of the 20 partial products consumes the bulk of the multiplication time. The summing of the partial products may be accelerated in two ways while keeping the hardware minimized: the summing may be done in a Wallace tree plus final adder (see FIG. 9) and the multiplier may be recoded to reduce the number of partial products by use of a Booth-type algorithm.

FIR odd arm 327 shown in FIG. 8 has both Wallace trees (the 12 rectangles with a Σ) and recoding of the multipliers (filter coefficients). The data samples are clocked in at the righthand portion of FIG. 8, and the hardwired recoded coefficients appear as the boxes with Xs with the corresponding coefficient noted as C1, . . . C17. Of course, the 67 coefficients split into 34 odd coefficients and 33 even coefficients. But the even coefficients are all zero except the center tap, $c_{34}$, which is equal to $2^{18}$ and does not need a multiplier except for a shift by 18. The 34 odd coefficients are symmetric, so there are only 17 independent coefficients, and these are the C1, . . . C17. Note both the top and bottom rows of coefficients to make up the total of 34.

Figure 9:
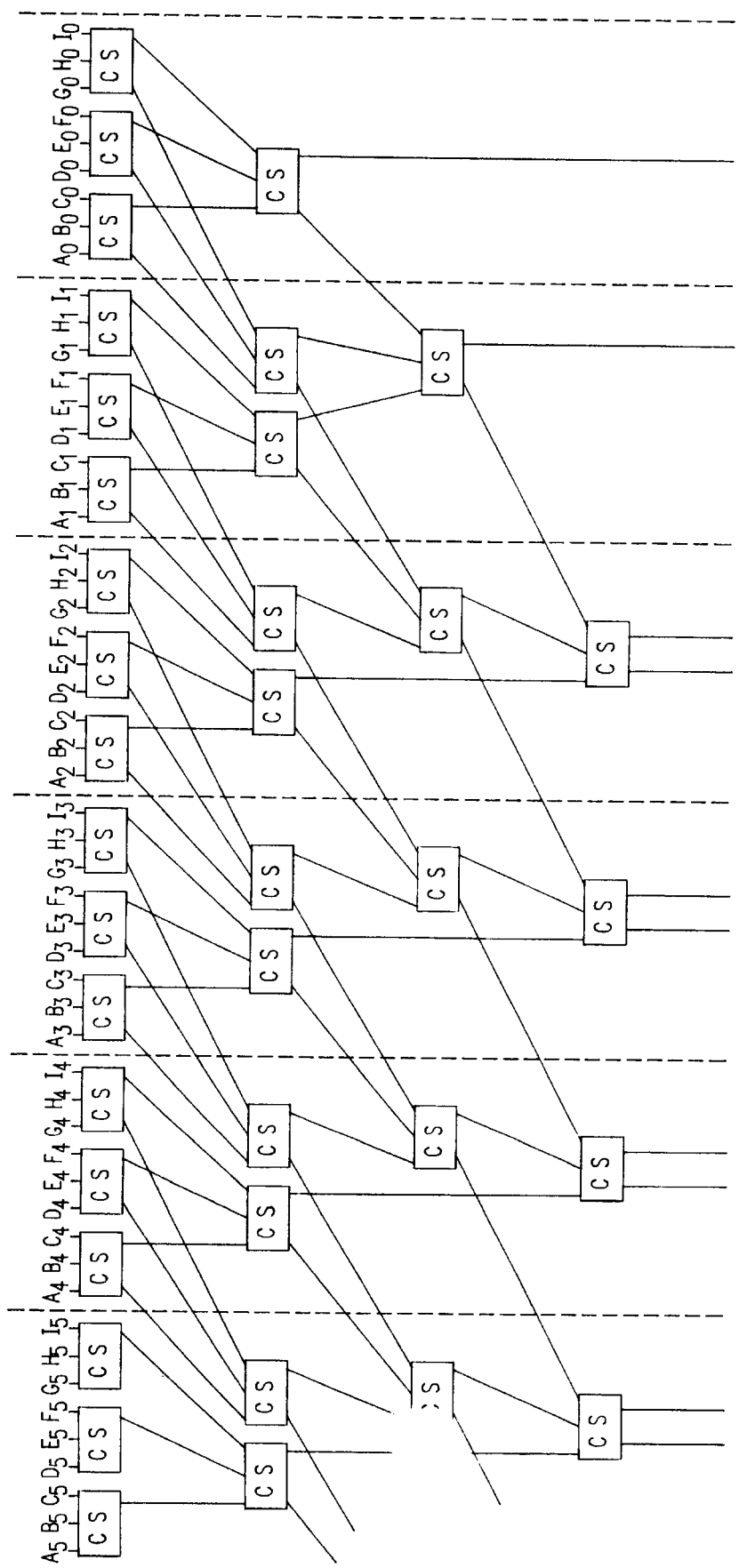
FIG. 9 shows a portion of a Wallace tree.

A Wallace tree consists of an array of full adders which have three inputs (the two bits being added plus the carry in from the sum of lower order bits) and two outputs (the sum bit plus the carry out to higher order bits). Hence, each layer of a Wallace tree roughly has ⅔ the number of terms of the previous layer. FIG. 9 shows a portion of a Wallace tree for adding nine numbers called A, B, C, . . . H, and I with a subscript indicating the bit order. The rectangles indicate full adders and the broken vertical lines group bits of the same order with the least significant bits on the right. Note that every carry out goes into the adjacent grouping to the left. As indicated by FIG. 9, after four levels the nine numbers have been added to form at most one sum bit and one carry bit in each bit position. The regularity of the tree is apparent in the lefthand portion of FIG. 9. The output of the final Wallace tree feeds a final adder as indicated by the output lines at the righthand edge of FIG. 8.

Recoding a multiplier to lessen the number of partial products may be done in various ways including the Booth algorithm which replaces groups of 1s with a leading 1 and a trailing −1. More explicitly, the foregoing example multiplier 0101 0101 0111 1111 1101 could be rewritten as 0101 0101 1000 0000 0001 minus 0000 0000 0000 0000 0100; that is, the groups of 1 bits representing $2^{10}, 2^9, \ldots 2^2$ are replaced by a bit representing $2^{11}$ minus a bit representing $2^2$ which just reflects the identity $2^{11}-2^2=2^{10}+2^9+\ldots+2^2$. Of course, this rewriting of the multiplier decreases the number of nonzero partial products from 14 to 7 at the cost of introducing a minus sign.

The even data is operated on only by the center coefficient $c_{34}$. Because the center coefficient equals a power of two ($2^{18}$) there is no need for an actual multiplier. The data is delayed and the bit weighting changed. The final value for the number of pipeline delays depends on the delays in the odd FIR filter arm and the front end of filter 300.

The odd data enters odd arm 327 of the FIR filter which has 34 taps. At each tap the data is recoded into partial products which feed the Wallace trees. Where possible, the pipelines have been moved to minimize hardware. By moving a pipeline from the bottom to the top data path, the need for registering the sum and carrys is eliminated, a savings of almost 48 flops each time this is done. This was only done in cases where the resulting Wallace tree would be 6 levels or less. The recoding of the 34 coefficients of odd arm 327 proceeded by a two step process: first a set of coefficients were derived by standard methods for a 67-tap half-band filter with a prescribed width and tolerance for the passband and stopband. The resulting coefficients were then perturbed to increase the groupings of 1s and 0s in order to have a more effective application of Booth's algorithm. The coefficient perturbations were assessed based on how they changed the filter characteristics, and the set of coefficients which yielded the best grouping of 1s and 0s while maintaining acceptable filter characteristics was selected. FIG. 10 shows the resulting set of coefficients together with their recodings (1 and −1 beneath each grouping of 1s). The total number of partial products reduces to 139 for all 67 taps.

Figure 11:
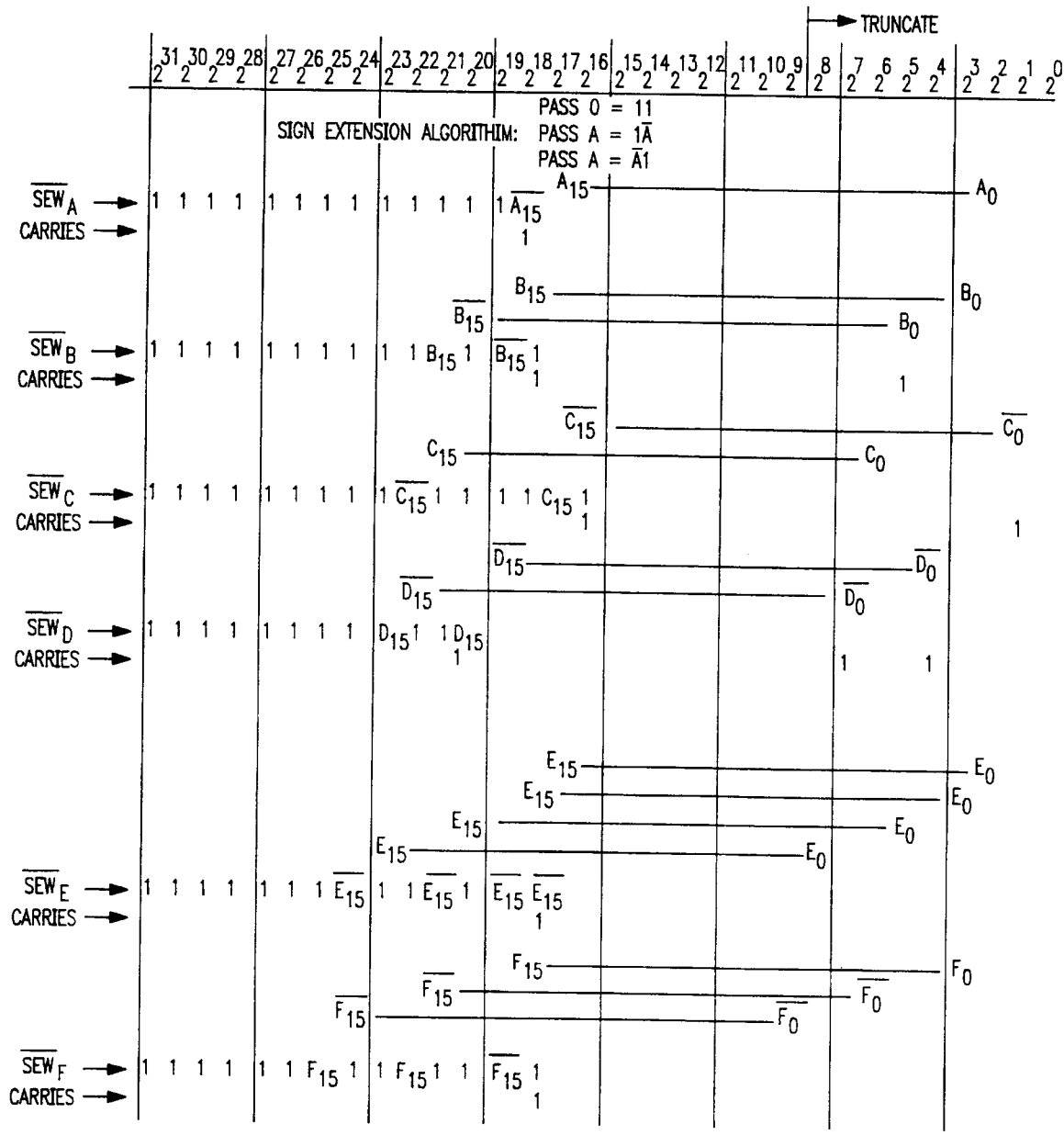
FIG. 11 lists the multiplicand locations within the Wallace trees.

A sign extension word was calculated for each different set of coefficients coming into each Wallace tree; see FIG. 11. In FIG. 11 the letters A through R (exclusive of O) represent the 16-bit samples and show the Wallace tree levels to which the 17 different coefficient recodings place the corresponding multiplicand sample's bits. For example, $c_1$ equals 4 (relative to $c_{34}$ equal to $2^{18}$) and this implies one partial product which arises from shifting the sample's bits two places; the sample's 16 bits are denoted by $A_{15}$ down to $A_0$ and are located under the 16 bit positions $2^{17}$ through $2^2$. Similarly, $c_3$ equals −24 which recodes to −32+8 and generates two partial products for its corresponding multiplicand sample B with bits $B_{15}$ through $B_0$ entered twice, once shifted 3 bits and once (negated) shifted 5 bits. If the multiplicand sample were negative, then its leading bit would be a 1 and sign extension 1s would be needed. The top lines in FIG. 15 illustrate how to handle this possibility: a sign extension word of 1s for A appears under $2^{19}$ and extending to the left edge ($2^{31}$ is the maximum shown). Also, the bit equal to the complement of $A_{15}$ is entered under $2^{18}$ and a carry bit 1 is also entered uner $2^{18}$. This procedure of entering extra bits has the following net effect: if $A_{15}$ equal 0 (so A is a positive number), then complemented $A_{15}$ equals 1 and sum of the sign extension 1s, the carry bit 1 and $A_{15}$ is zero because it amounts to an addition which overflows at the left edge. Thus there is no net effect if A is positive. Conversely, for negative A the MSB equal 1, and the sum of the sign extension 1s, the carry bit 1 and $A_{15}$ is a 1 under each of $2^{18}$ to the left edge; that is, the proper sign extension bits for a negative number. Similarly for each other multiplicand sample's partial products taken as a group. In particular, note for multiplicand sample B that the negated B shifted 5 bits generates a carry bit under $2^5$ due to two's complement negation being complementation followed by adding 1 to the least significant bit.

Figure 12:
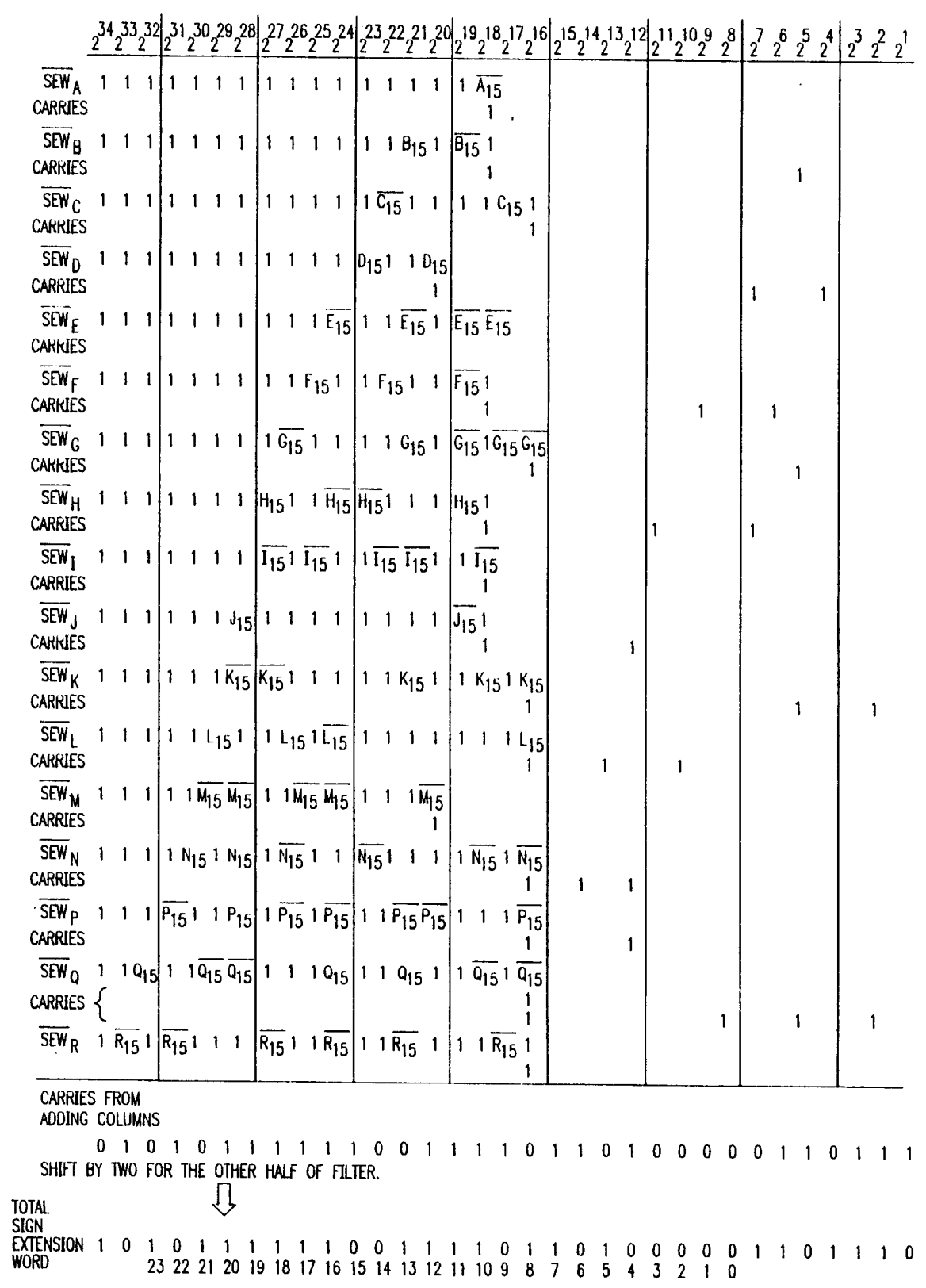

All the 1's contained in the sign extension words for the partial products may be added together to create a single "Sign Extension Constant" as shown in FIG. 12. This has been injected into a "small" Wallace tree that is closest to the filter output to minimize hardware. All 1's were added, even those below the line of truncation in the partial products.

Truncated Multiplier Hardware

To save hardware, filter 300 has the low bit weight positions in the Wallace trees truncated. This removes a portion of the Wallace tree hardware and simply disregards the corresponding bits which would have entered the truncated portions. FIG. 13 shows the method used to determine location of the truncation in the Wallace trees. In particular, the columns add the number of bits under each power of 2 for each Wallace tree by adding the number of partial products plus the number of carry bits shown in FIG. 11. Accumulate the number of bits for a column by considering the carries from lower power of 2 columns, and this determines the maximum which could be disregarded. In particular, for the $2^8$ column the total is 122. This means that the maximum truncated would be $122 \times 2^8$ which is less than $2^{15}$ and thus only directly influences the $2^{14}$ bit and lower. Similarly, for the $2^9$ column the maximum truncated would be $135 \times 2^9$, or less than $2^{17}$. Now the largest MSB of data is $2^{32}$ from Wallace tree 12 (see FIG. 11), so rounding to 16 bits (the input data accuracy) implies that $2^{17}$ will be the LSB and $2^{16}$ will be the rounded bit. Hence, the truncation up to and including $2^8$ but excluding $2^9$ and higher will not directly affect the rounding bit. For Mode 1 (decimation mode), bit positions $2^{34}$–$2^{18}$ are selected from output of final adder, and all other modes bit positions $2^{33}$–$2^{17}$ are selected. The LSB is $2^{18}$ for mode 1, and $2^{17}$ for all other modes. When the user is selecting 16 bit output, this LSB is the bit position where a 1 is added, then the LSB and below is truncated.

Further, the effects of this hardware truncation on the filter performance should be negligible in the spectral sense. Random mistakes in the filter response computation for points of the time domain output will not greatly effect the spectral response because the spectral response is a Fourier transform of the time domain responses. A Fourier transform invokes integration over time domain responses, and random noise has a uniform power spectral density without any spectral spikes. This means that tolerances in passband and stopband will not be jeopardized. Thus the hardware savings by hardware truncation has a time domain impact which spectrally averages out by the Fourier transform integration. Also, truncations greater than or less than filter 300's may be used; the method of focussing on the rounding bit may be changed. Greater truncation saves more hardware but creates greater noise, and conversely for less truncation.

Note that the architecture does not take advantage of coefficient symmetry. The use of a pre-adder to add the two data words corresponding to symmetric coefficients for a single multiplication using the coefficient and then generating the partial products may have created a delay path that would have slowed down the overall operation.

Rounder

Rounders 342 and 344 allow the user to control the number of output bits. Rounding is done by generating a carry_in for the bit position just below the LSB of interest and then truncating the output. Saturation detect logic disables the carry_in when the most positive number (0111 . . . 111xxx when rounding away the last four bits) is present and the carry_in would have resulted in adder rollover to the most negative number (1000 . . . 000xxx which truncates to 1000 . . . 00). FIG. 14 illustrates the saturation detection circuitry with DATA bit inputs and SETRND (setround) inputs. Also provided is the function of zeroing the bits below the LSB of interest after rounding.

The critical speed path would be from DATA_IN changing, through the saturation detect to signal CARRY0, and through the 17 bit adder. The fastest 17 bit adder will come from a 17 bit tree adder with the unused B inputs demorganized to reduce logic.

True/complementer

The true/complementers 322, 324, 332, and 334 all have saturation compensation; whereas, true/complementer 332 must also include accumulator overflow compensation. First consider simple saturation compensation as would be performed by 16-bit true/complementers 322, 324, and 334.

Saturation arises from the asymmetry of the two's complement representation of numbers. In particular, for 16-bit numbers the most significant bit (MSB) represents the sign and the remaining fifteen bits represent the magnitude of the number. The sign bit is 0 for positive and 1 for negative numbers. Negation of a number is by taking the complement of every bit (including the sign bit) and then adding 1 to the least significant bit (LSB). This makes addition simple but makes negative numbers odd-looking due to their complementary nature. In particular, zero is represented by 0000 0000 0000 0000, plus one by 0000 0000 0000 0001, and minus one by 1111 1111 1111 1111. Taking the complement and adding one clearly interchanges plus one and minus one and keeps zero invariant. However, this representation of numbers is asymmetric in that there is one more negative number than positive number due to zero being one of the numbers with a sign bit 0. Indeed, the largest positive number is $2^{15}$–1 and is represented by 0111 1111 1111 1111, but the negative number with the largest magnitude is $-2^{15}$ and is represented by 1000 0000 0000 0000. Now taking the two's complement of $2^{15}$–1's representative yields 1000 0000 0000 0001 which represents $-(2^{15}-1)$, as expected. But the two's complement of $-2^{15}$'s representative 1000 0000 0000 0000 is again 1000 0000 0000 0000, analogous to the two's complement of 0000 0000 0000 0000 reproducing itself. To handle this case of an input equal to $-2^{15}$, true/complementers 322, 324, and 334 have a detection circuit for 1000 0000 0000 0000 and force an output of the largest positive number 0111 1111 1111 1111 rather than taking the erroneous two's complement. Thus there will be an error of one bit, but this is the best that can be True/complementer 332 compensates for saturation and also for overflow from the adder of filter odd arm 327. True/complementer 332 outputs 17 bits because odd arm 327 outputs 17 bits and rounding will be done in rounder 342. In particular, the adder has extra bits above the 17 bits to be output, and these bits are used to monitor overflow. In decimation mode for half-band filter 300, the 17th($2^{34}$) and 18th($2^{35}$) bits are compared, and for the other three modes (interpolation mode, downconvert plus decimate mode, and interpolate plus upconvert mode) the 17th($2^{33}$), 18th($2^{34}$), and 19th($2^{35}$) bits are monitored. If an overflow occurs, then these bits will differ and an overflow flag will be set (active+1). With overflow the largest positive number or the negative number with largest magnitude will be output. The $2^{35}$ bit will be used as the proper sign bit. These signals combine with the complement (–1 multiply) signal (active+1) at input LO of each cell to determine the overflow data output as follows:

| overflow | sign | complement | overflow data bits |
|---|---|---|---|
| 1 | 0 | 0 | 0 1111 1111 1111 1111 |
| 1 | 1 | 0 | 1 0000 0000 0000 0000 |
| 1 | 0 | 1 | 1 0000 0000 0000 0000 |
| 1 | 1 | 1 | 0 1111 1111 1111 1111 |

Even without overflow indicated true/complementer saturates to the largest positive number (0 1111 1111 1111 1111) when complementing the negative number with the largest magnitude (1 0000 0000 0000 0000).

True/complementer 332 provides saturation in the same manner as true/complementers 322, 324, and 334.

MODIFICATIONS AND VARIATIONS

The preferred embodiments may be varied in many ways while retaining the features of a filter multiplier using Wallace trees with all lower bits hardware truncated and joint saturation plus overflow compensation. For example, the filter need not be a half-band filter, but any digital filter with multipliers which yield products that are rounded off. The hardware contributing only to bits which are rounded off could be truncated.

What is claimed is:

1. A digital filter comprising:

a first data stream input port for N-bit data samples;

first and second multipliers for downconverting said data samples;

adders for summing partial products of the downconverted data samples and filter coefficients, and with the K least significant bits of each partial product ignored for K a positive integer;

third and fourth multipliers for upconverting the summed partial products, said adders being connected between pairs of said multipliers; and a local oscillator for providing sines and cosines to said multipliers for up and down conversion.

2. The filter of claim 1, wherein:

said multipliers and adders are partitioned into two separate series of said multipliers and adders to form an odd coefficient filter arm and an even coefficient filter arm; and all but one of said filter coefficients in the partial products in said even coefficient arm are zero, whereby said filter forms a half-band filter.

3. The filter of claim 2, further comprising:

(a) a second data stream input port coupled to said even coeffeicient filter arm;

(b) with (i) said first multiplier having inputs coupled to said first data stream input port and said cosines of said local oscillator, and output coupled to said odd coefficient filter arm, (ii) said second multiplier having inputs coupled to said sines of said local oscillator and to a multiplex of said second data stream input port and said first data stream input port, and output coupled to said even coefficient filter arm, (iii) said third multiplier having inputs coupled to said odd coefficient arm and said cosines of said local oscillator, and output coupled to a first filtered data stream output port, and (iv) said fourth multiplier having inputs coupled to said even coefficient filter arm and said sines of said local oscillator, and output coupled to both said first filtered data stream output port and a second filtered data stream output port.

4. The filter of claim 3, wherein:

(a) said local oscillator outputs only sines and cosines of multiples of $\pi/2$; and (b) each of said first, second, and fourth multipliers is a true/complementer with saturation compensation and said third multiplier is a true/complementer with both saturation compensation and accumulator overflow compensation.

5. A digital filter comprising:

two ports for receiving streams of data bits;

an odd coefficient filter arm comprising a first of said input ports, a first downconversion multiplier, a first finite impulse response (FIR) filter, and a first upconversion multiplier all coupled in series;

an even coefficient filter arm comprising a second of said input ports, a second downconversion multiplier, a second FIR filter, and a second upconversion multiplier all coupled in series; and an oscillator for providing sines and cosines, the sines being provided to said second downconversion multiplier and to said second upconversion multiplier, the cosines being provided to said first downconversion multiplier and to said first upconversion multiplier.

6. The digital filter of claim 5 wherein said second FIR filter includes coefficients, all but one of which are zero, whereby the digital filter is a half-band filter.

7. The digital filter of claim 5 wherein said first and second FIR filters sum partial products of (a) filter coefficients and (b) said streams of data bits, and the K least significant data bits of the partial products are ignored.

8. The digital filter of claim 5 further comprising a first output port for a stream of filtered data coupled to said first upconversion multiplier, and a second output port for a stream of filtered data coupled to said second upconversion multiplier and to said first output port.

9. The digital filter of claim 5 wherein said sines and cosines are multiples of $\pi/2$.

10. The digital filter of claim 5 further comprising a multiplexer coupled in series between said second input port and said second downconversion multiplier, and coupled to said first input port.

11. The digital filter of claim 5 further comprising means coupled to the digital filter for selecting one of the following operating modes for the digital filter: decimation by two filtering, and interpolation by two filtering.

12. The digital filter of claim 11 wherein said operating modes selectable by said means for selecting further comprise quadrature downconversion of I and Q channels with decimation by two filtering, and interpolation by two filtering of complex baseband signal and quadrature upconversion.

* * * * *